(12) United States Patent
Lai

(10) Patent No.: US 8,422,227 B2
(45) Date of Patent: Apr. 16, 2013

(54) ELECTRONIC DEVICE AND HEAT DISSIPATION DEVICE THEREOF

(75) Inventor: Yu-Chia Lai, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 158 days.

(21) Appl. No.: 13/070,460

(22) Filed: Mar. 23, 2011

(65) Prior Publication Data

US 2012/0162913 A1    Jun. 28, 2012

(30) Foreign Application Priority Data

Dec. 27, 2010   (TW) ............................... 99146008 A

(51) Int. Cl.
*H05K 7/20* (2006.01)

(52) U.S. Cl.
USPC .......................................... 361/695; 361/694

(58) Field of Classification Search ............. 361/679.51, 361/694, 695
See application file for complete search history.

(56) References Cited

U.S. PATENT DOCUMENTS

| | | | |
|---|---|---|---|
| 4,648,007 A * | 3/1987 | Garner ........................... | 361/695 |
| 6,005,770 A * | 12/1999 | Schmitt ......................... | 361/695 |
| 6,042,348 A * | 3/2000 | Aakalu et al. ............... | 417/423.5 |
| 6,181,557 B1 * | 1/2001 | Gatti .............................. | 361/695 |
| 6,710,240 B1 * | 3/2004 | Chen et al. ................. | 174/17 VA |
| 6,991,533 B2 * | 1/2006 | Tsai et al. ..................... | 454/184 |
| 7,835,149 B2 * | 11/2010 | Li et al. .................... | 361/679.49 |
| 2008/0151490 A1 * | 6/2008 | Fan et al. ...................... | 361/687 |

\* cited by examiner

*Primary Examiner* — Gregory Thompson
(74) *Attorney, Agent, or Firm* — Altis Law Group, Inc.

(57) ABSTRACT

An electronic device includes a housing, a printed circuit board received in the housing, a plurality of heat-generating elements mounted on the printed circuit board and a heat dissipation device secured to an end of the housing. The heat dissipation device includes a fan module and a bracket securing the fan module onto the housing. The housing includes a first side wall and a second side wall with a passage defined therebetween. The heat-generating elements are positioned in the passage. The fan module includes first and second fans arranged side by side. The bracket defines first and second openings corresponding to the first and second fans respectively for air flow generated by the fans. An air baffle is pivotally connected to the bracket and capable of turning to close a corresponding opening corresponding to a failing fan upon failure of either the first or second fan.

4 Claims, 3 Drawing Sheets

ELECTRONIC DEVICE AND HEAT DISSIPATION DEVICE THEREOF

BACKGROUND

1. Technical Field

The present disclosure relates generally to electronic devices and heat dissipation devices used in the electronic devices, and more particularly to an electronic device having an improved active heat dissipation device.

2. Description of Related Art

Generally, the power and heat of electronic devices such as servers are increased dramatically, thus the cooling requirements thereof are also increasing. A typical electronic device is generally equipped with a fan module, to provide forced cooling airflow to cool the electronic components in the electronic device. Compared with other heat dissipation equipments such as heat sinks, the fan module has poor stability and reliability, and a failure of a single fan in the fan module often occurs, which causes a back flow phenomenon at the failed or failing fan and resulting in an inefficient cooling of the electronic components in the electronic device. Therefore, heat of the electronic components cannot be timely dissipated and a normal operation of the electronic device cannot be sustained.

What is needed therefore is an electronic device having a heat dissipation device which can overcome the above mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
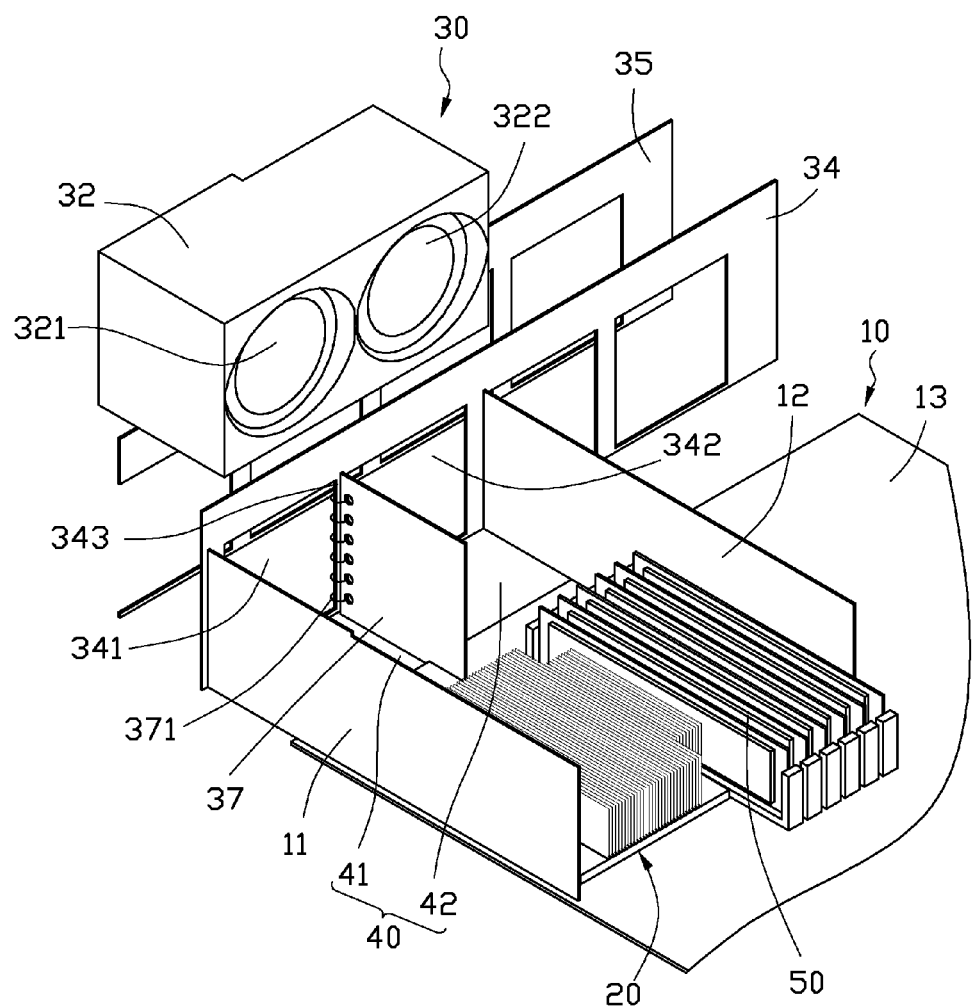
FIG. 1 is an isometric, exploded view of an electronic device in accordance with an embodiment of the present disclosure.

As shown in FIG. 1, an electronic device provided by the embodiment of the present disclosure can be a server. The electronic device comprises a housing 10, a plurality of heat-generating elements 20 and a heat dissipation device 30 accommodated in the housing 10. The housing 10 comprises a bottom plate, a top plate, a plurality of side walls enclosing to define a space for receiving various elements or components of the electronic device such as the heat-generating elements 20. A first side wall 11 and a second side wall 12 are shown in FIG. 1. The bottom and top plates and other side walls are not shown in the drawings for brevity. It is understood that other additional side walls can be included to separate the space of the housing 10 into much more spaces. The first and second side walls 11, 12 are perpendicular to the bottom plate and together define a passage 40 for air flowing through.

The housing 10 accommodates therein a printed circuit board 13 on which the heat-generating elements 20 are mounted. A plurality of heat sinks 50 are mounted on the heat-generating elements 20 for dissipating the heat generated by the heat-generating elements 20. The heat sinks 50 each comprises a plurality of fins (not labeled) parallel to each other and also parallel to an extending direction of the passage 40 defined between the first and second side walls 11, 12.

Figure 2:
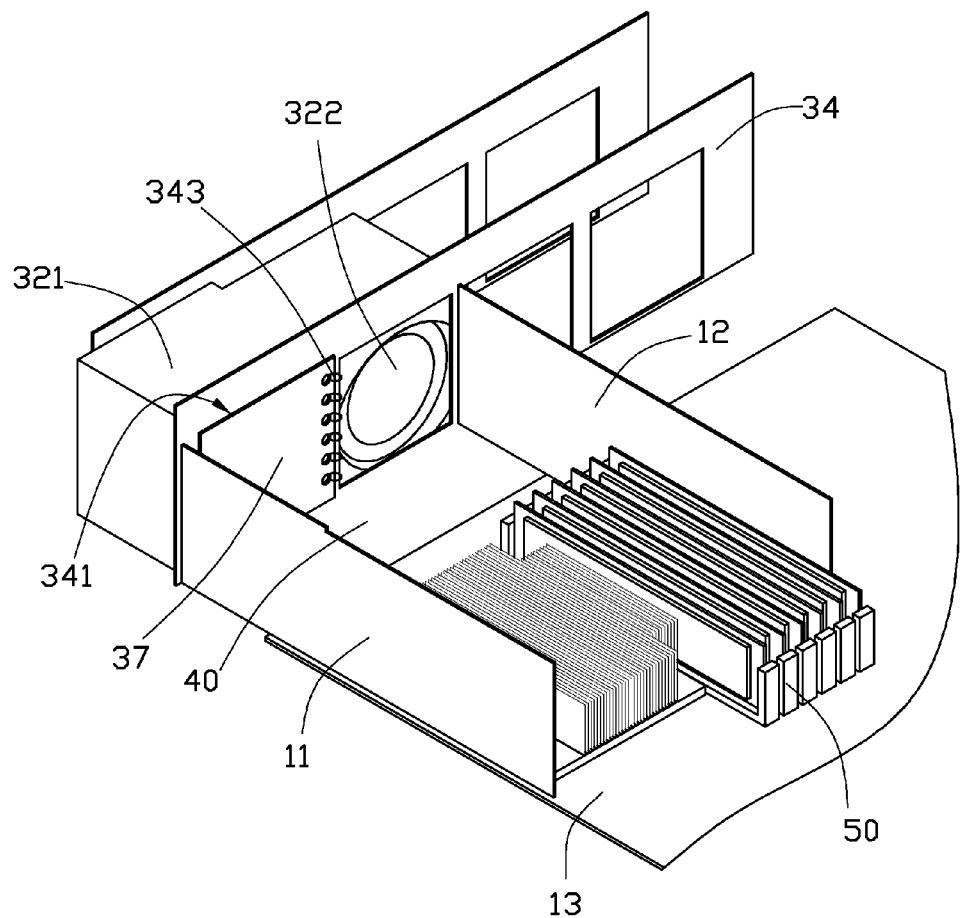
FIG. 2 is an isometric, assembled view of the electronic device of FIG. 1, wherein a first fan is failing to operate, and an air baffle is turned to the first fan.
Figure 3:
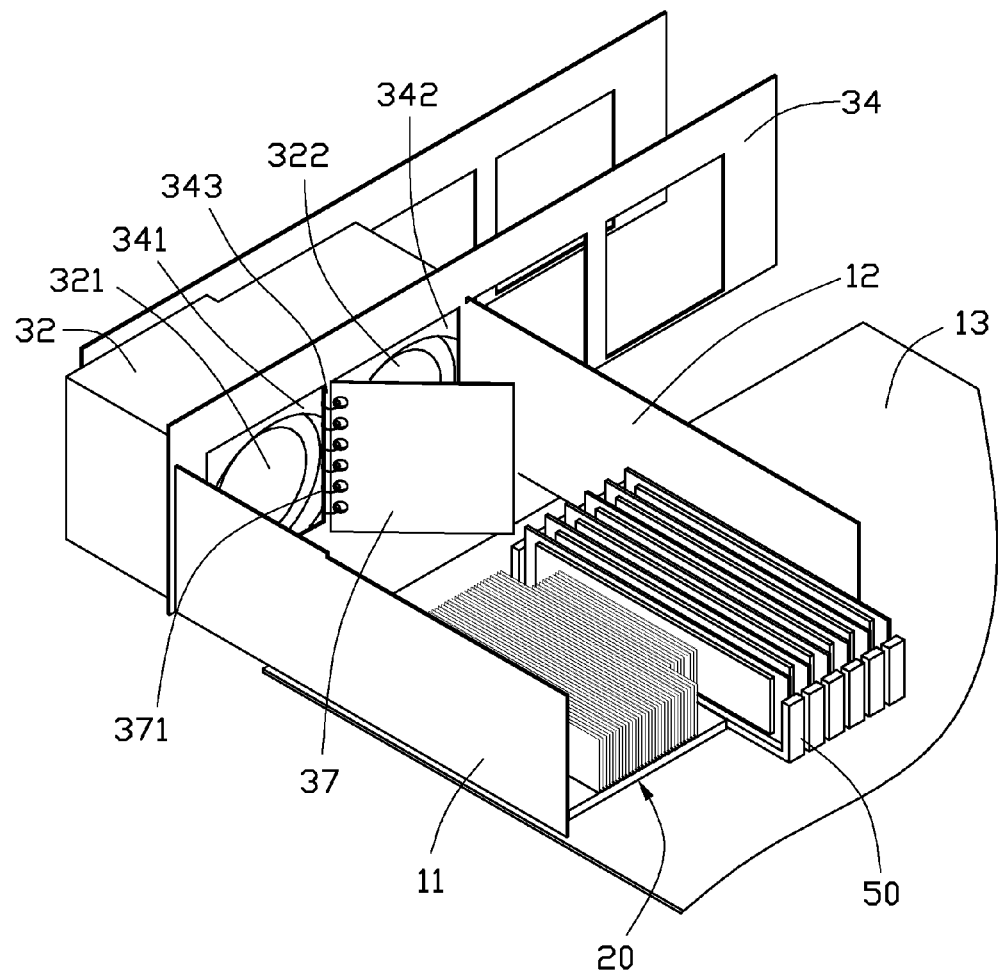
FIG. 3 is another isometric, assembled view of the electronic device of FIG. 1, wherein a second fan is failing to operate, and the air baffle is turned to the second fan.

The heat dissipation device 30 comprises a fan module 32 and a bracket 34 for securing the fan module 32 on the housing 10. Specifically, the fan module 32 is secured on a same end of the first and second side walls 11, 12. The fan module 32 comprises a first fan 321 and a second fan 322 arranged side by side. A first opening 341 is defined in the bracket 34 corresponding to the first fan 321. A second opening 342 is defined in the bracket 34 corresponding to the second fan 322. The first and second fans 321, 322 are facing toward the passage 40, and the forced airflow generated by the first and second fans 321, 322 can flow through the first and second openings 341, 342, respectively, and along the passage 40, to thereby cool the heat-generating elements 20 and the heat sinks 50. The bracket 34 further comprises a bar 343 separating the first opening 341 and the second opening 342. An air baffle 37 is pivotally secured on the bar 343 and is capable of rotating around the bar 343. Pivotal connection between the air baffle 37 and the bar 343 can be accomplished by conventional pivot mechanisms. In the present embodiment, a plurality of securing rings 371 are mounted on and inserted through the air baffle 37 to obtain a pivotal connection between the bar 343 and the air baffle 37. When the air baffle 37 is turned to the first fan 321, as shown in FIG. 2, the first opening 341 can be closed, so that air cannot flow through the first opening 341. When the air baffle 37 is turned to the second fan 322, as shown in FIG. 3, the second opening 342 can be closed so that air cannot flow through the second opening 342.

Further, the heat dissipation device 30 may comprise a second bracket 35. The fan module 32 may be sandwiched between the bracket 34 and the second bracket 35 for enhancing the stability of the fan module 32.

When the electronic device is in use, the first fan 321 and the second fan 322 operate normally or continuously, and the airflow provided by the first and second fans 321, 322 enables the air baffle 37 rotating to stay at a center position of the passage 40 and parallel to the first and second side walls 11, 12, as shown in FIG. 1. The passage 40 is divided into a first passage 41 and a second passage 42 by the air baffle 37. The airflow generated by the first and second fans 321, 322 can flow through the first and second passages 41, 42 to cool the heat-generating elements 20 and the heat sinks 50.

Referring to FIG. 2, if the first fan 321 is failing to operate due to malfunction, the air baffle 37 is turned to the first fan 321 to close the first opening 341, as being caused by the pressure differences between the first and second fans 321, 322. Thus, the airflow generated by the second fan 322 would then not flow through the first opening 341, and thus the back flow phenomenon at the first fan 321 is thereby eliminated, whereby a cooling efficiency of the heat dissipation device 30 is sustained.

Referring to FIG. 3, if the second fan 322 is failing to operate due to malfunction, the air baffle 37 is forced to turn to the second fan 322 and close the second opening 342 based on the same operating principle described previously for the first fan 321. Thus, the back flow phenomenon at the second fan 322 is eliminated.

The air baffle 37 being equipped on the bracket 34 of the fan module 32 rather than to be on each of the first and second fans 321, 322 brings forth the fan module 32 having simpler construction. In addition, a single air baffle 37 positioned between the first and second fans 321, 322 can avoid the back flow phenomenon at both the first and second fans 321, 322, which has the advantage of cost reduction.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An electronic device, comprising:
   a housing comprising a first side wall and a second side wall;
   a passage defined between the first and second side walls;
   a circuit board accommodated in the housing;
   a plurality of heat-generating elements mounted on the circuit board and positioned in the passage;
   a fan module secured on a same end of the first and second side walls for providing airflow along the passage to cool the heat-generating elements, the fan module comprising a first fan and a second fan arranged side by side;
   a bracket securing the fan module on the same end of the first and second side walls, the bracket defining a first opening corresponding to the first fan and a second opening corresponding to the second fan, respectively; and
   an air baffle pivotally connected to the bracket and located between the first opening and the second opening, the air baffle is positioned between the first and second side walls and divides the passage into a first passage corresponding to the first fan and a second passage corresponding to the second fan when the first and second fans are operating continuously, and the air baffle is rotated around the bracket and turned to close a corresponding opening corresponding to the failing fan upon the failure of one of the first and second fans to operate.

2. The electronic device of claim 1, wherein a plurality of heat sinks are mounted on the heat-generating elements.

3. The electronic device of claim 1 further comprising a second bracket, and the fan module being secured between the bracket and the second bracket.

4. The electronic device of claim 1, wherein the bracket comprises a bar, the air baffle being secured on the bar, and the first and second openings being separated by the bar.

* * * * *